(12) United States Patent
Shrivastava et al.

(10) Patent No.: US 8,097,930 B2
(45) Date of Patent: Jan. 17, 2012

(54) SEMICONDUCTOR DEVICES WITH TRENCH ISOLATIONS

(75) Inventors: Mayank Shrivastava, Mumbai (IN); Harald Gossner, Riemerling (DE); Ramgopal Rao, Mumbai (IN); Maryam Shojaei Baghini, Mumbai (IN)

(73) Assignee: Infineon Technologies AG, Neubiberg (DE)

( * ) Notice: Subject to any disclaimer, the term of this patent is extended or adjusted under 35 U.S.C. 154(b) by 336 days.

(21) Appl. No.: 12/188,802

(22) Filed: Aug. 8, 2008

(65) Prior Publication Data

US 2010/0032773 A1   Feb. 11, 2010

(51) Int. Cl.
 *H01L 29/00* (2006.01)

(52) U.S. Cl. ........ 257/506; 257/339; 257/343; 257/355; 257/356; 257/E29.268; 257/E29.269

(58) Field of Classification Search .................. 257/339, 257/343, 355, 356, 506, E29.268, E29.269
See application file for complete search history.

(56) References Cited

U.S. PATENT DOCUMENTS

| | | | |
|---|---|---|---|
| 4,920,397 A * | 4/1990 | Ishijima ............... | 257/334 |
| 5,109,263 A * | 4/1992 | Nanba et al. .......... | 257/583 |
| 5,304,827 A | 4/1994 | Malhi et al. | |
| 5,306,656 A | 4/1994 | Williams et al. | |
| 5,313,082 A | 5/1994 | Eklund | |
| 5,398,205 A * | 3/1995 | Yamaguchi ............ | 365/149 |
| 5,406,110 A | 4/1995 | Kwon et al. | |
| 5,430,316 A | 7/1995 | Contiero et al. | |
| 5,479,033 A * | 12/1995 | Baca et al. ........... | 257/192 |
| 5,501,994 A | 3/1996 | Mei | |
| 5,650,658 A | 7/1997 | Beasom | |
| 5,736,766 A | 4/1998 | Efland et al. | |
| 5,747,850 A | 5/1998 | Mei | |
| 5,777,371 A | 7/1998 | Kawaguchi et al. | |
| 6,660,603 B2 | 12/2003 | Mitros | |
| 6,960,807 B2 | 11/2005 | Pendharkar | |
| 7,005,354 B2 | 2/2006 | Pan et al. | |
| 7,176,091 B2 | 2/2007 | Pendharkar | |
| 7,687,348 B2 * | 3/2010 | Tani .................... | 438/262 |
| 7,838,940 B2 * | 11/2010 | Schneider et al. .... | 257/355 |

OTHER PUBLICATIONS

Appels, J.A., et al., "High Voltage Thin Layer Devices (RESURF Devices)," IEEE Electron Devices Meeting (IEDM) Tech. Digest, 1979, pp. 238-241.

Imam, M., et al., "Efficacy of Charge Sharing in Reshaping the Surface Electric Field in High-Voltage Lateral RESURF Devices," IEEE Transactions on Electron Devices, Jan. 2004, pp. 141-148, vol. 51, No. 1.

(Continued)

*Primary Examiner* — Andy Huynh
(74) *Attorney, Agent, or Firm* — Slater & Matsil, L.L.P.

(57) ABSTRACT

In an embodiment, a semiconductor device is provided. The semiconductor device may include a first diffusion region, a second diffusion region an active region disposed between the first diffusion region and the second diffusion region, a control region disposed above the active region, a first trench isolation disposed laterally adjacent to the first diffusion region opposite to the active region, and a second trench isolation disposed between the second diffusion region and the active region. The second trench isolation may have a smaller depth than the first trench isolation.

36 Claims, 13 Drawing Sheets

OTHER PUBLICATIONS

Moscatelli, A., et al., "LDMOS Implementation in a 0.35 μm BCD Technology (BCD6)," The 12$^{th}$ International Symposium of Power Semiconductor Devices and ICs, May 22-25, 2000, pp. 323-326.

Takeda, E., et al., "An Empirical Model for Device Degradation Due to Hot-Carrier Injection," IEEE Electron Device Letters, Jan. 1983, pp. 111-113, vol. 4, No. 1.

Efland, T., et al., "Optimized Complementary 40V Power LDMOS-FETs Use Existing Fabrication Steps in Submicron CMOS Technology," IEEE Electron Devices Meeting (IEDM) Tech. Digest, Dec. 1994, pp. 399-402.

Moens, P., et al., "A Novel Hot-Hole Injection Degradation Model for Lateral nDMOS Transistors," IEEE Electron Devices Meeting (IEDM) Tech. Digest, 2001, pp. 877-880.

Varghese, D., et al., "Off-State Degradation in Drain-Extended NMOS Transistors: Interface Damage and Correlation to Dielectric Breakdown," IEEE Transactions on Electron Devices, Oct. 2007, pp. 2669-2678, vol. 54, No. 10.

Hower, P., et al., "Integrating Power Devices into Silicon Roadmaps," IEEE Proceedings on Circuits, Devices and Systems, Feb. 2006, pp. 73-78, vol. 153, No. 1.

* cited by examiner

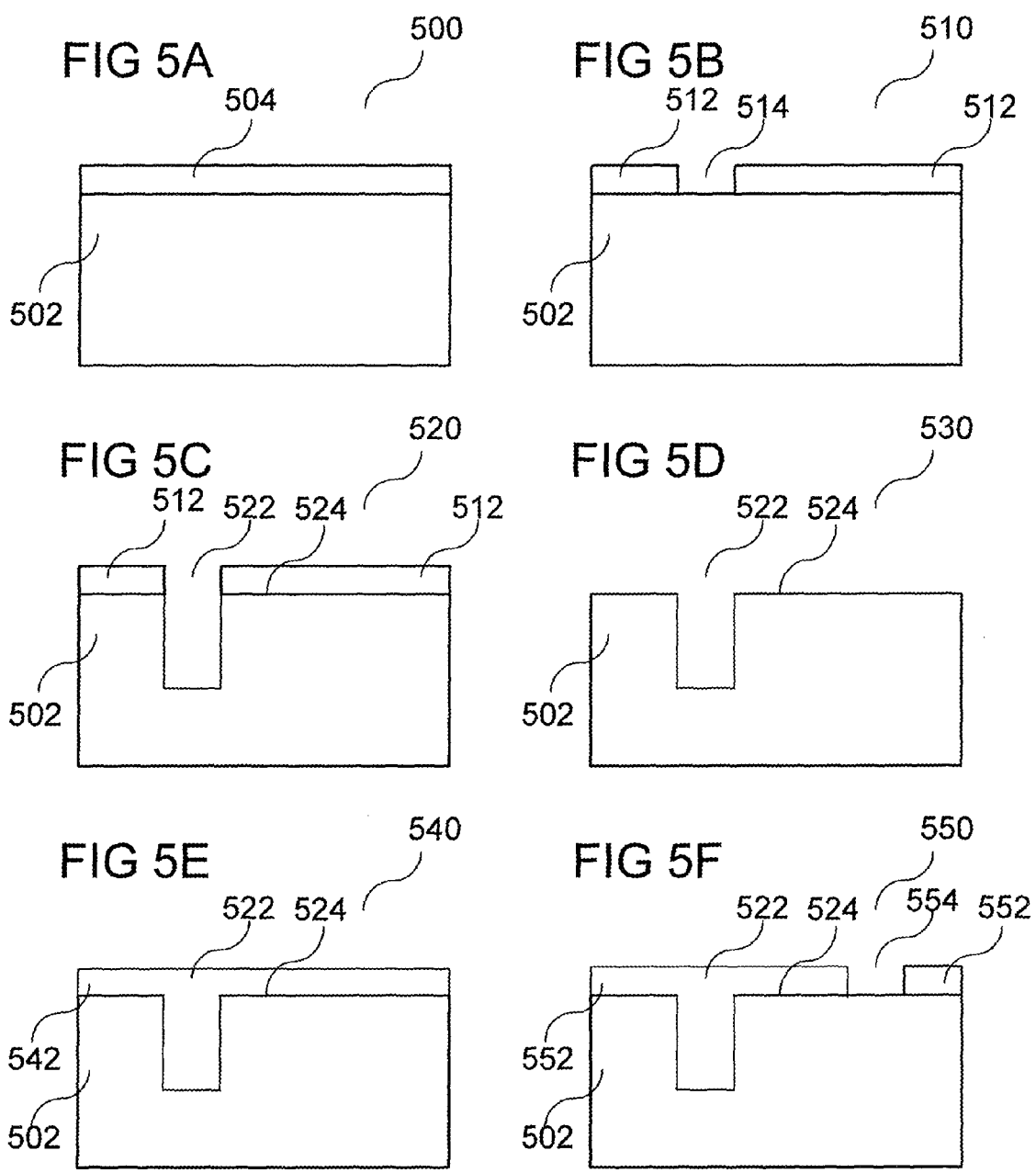

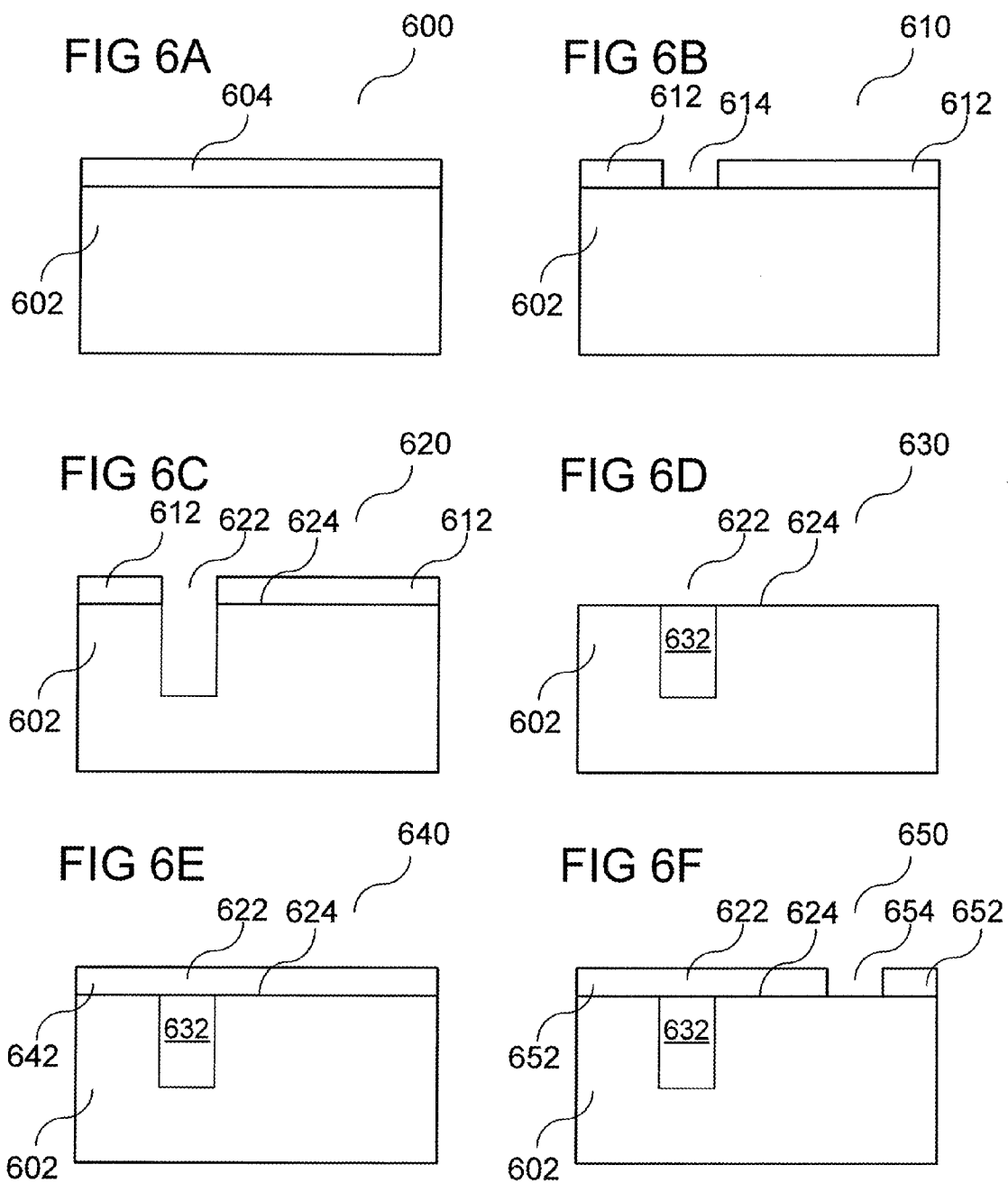

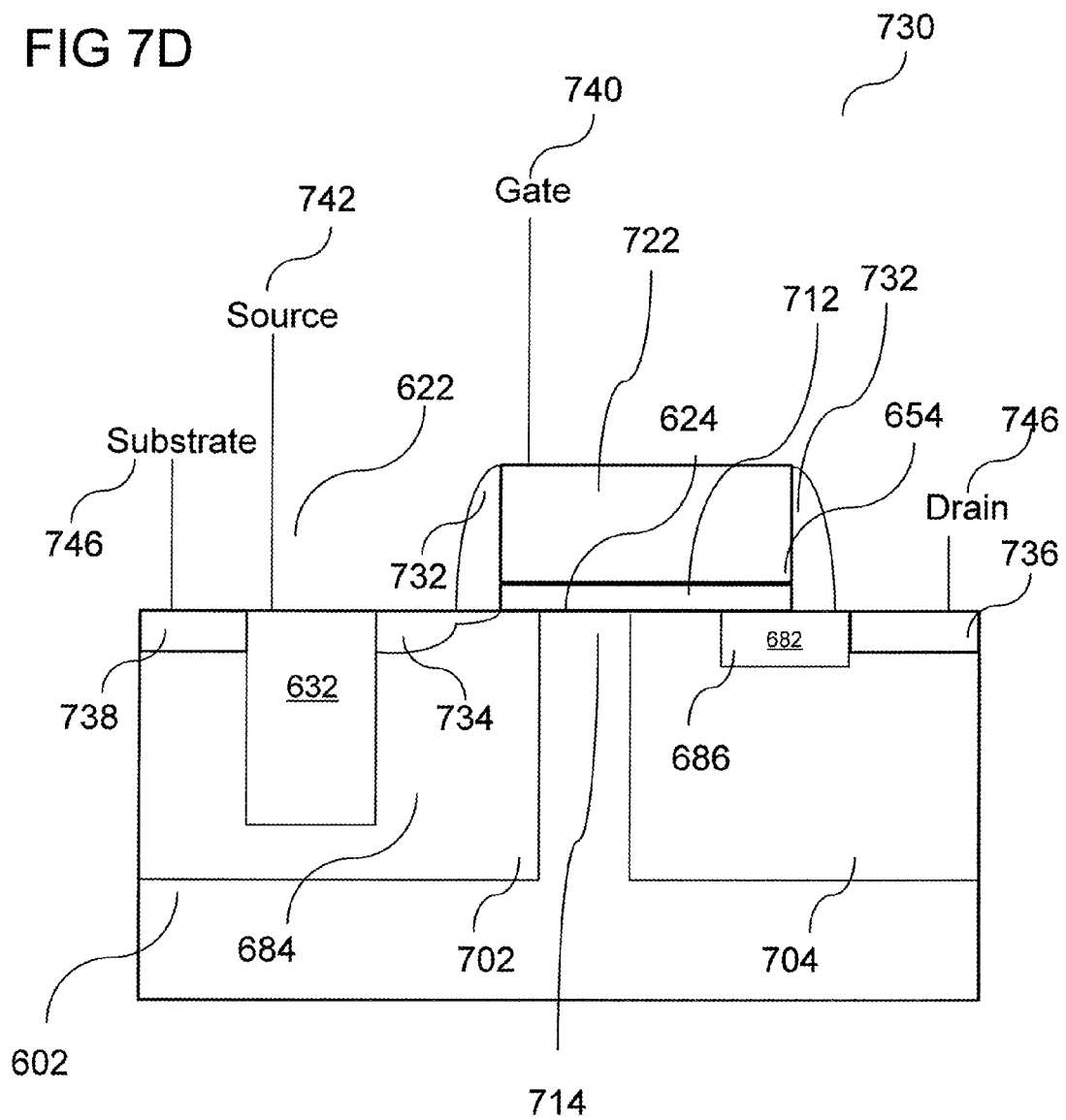

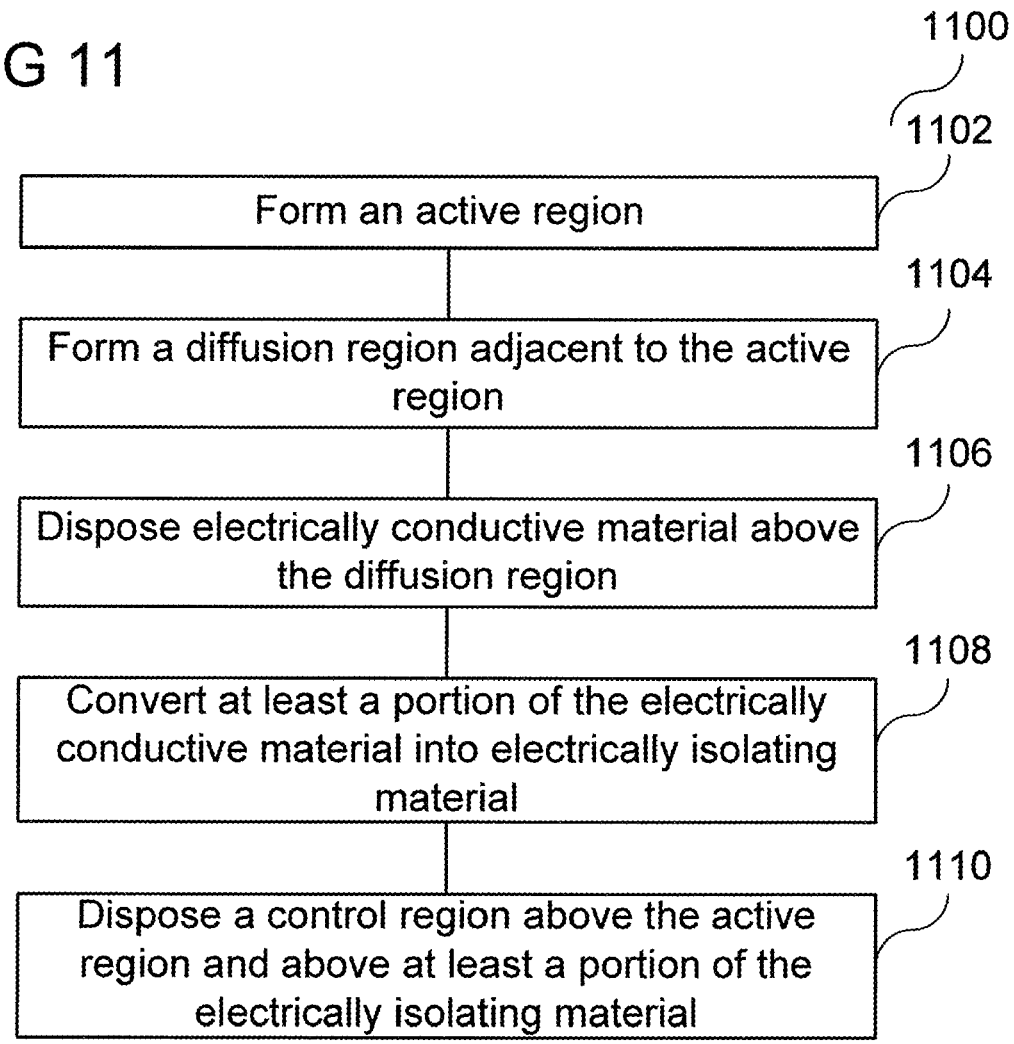

SEMICONDUCTOR DEVICES WITH TRENCH ISOLATIONS

TECHNICAL FIELD

Embodiments relate generally to semiconductor devices and to methods for manufacturing a semiconductor device.

BACKGROUND

LDDMOS (Lightly Doped Drain Metal Oxide Semiconductor) (also referred to as RESURF) device is currently in use for high voltage I/O applications. At scaled technology nodes, a high drain resistance because of LDD region (which is used to increase the breakdown voltage of the device) may degrade its mixed signal performance. It may also show a high hot carrier degradation. To achieve higher breakdown voltage with improved mixed signal performance, other drain extended MOS devices were proposed such as the so called DeMOS, but these show very high hot carrier degradation and a high electrical field of the gate oxide as well. To reduce the electrical field in the gate oxide, an STI (Shallow Trench Isolation) was realized underneath a gate-drain overlap region using a standard STI process, wherein the STI has the same depth as the STIs provided for the device-to-device isolation. However, these STI DeMOS devices may have a worse mixed signal performance as compared to the other two device types.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIGS. 5A to 5I show a process flow for manufacturing an intermediate semiconductor device having two trench isolations in accordance with an embodiment;

FIGS. 6A to 6I show a process flow for manufacturing an intermediate semiconductor device having two trench isolations in accordance with another embodiment;

FIGS. 7A to 7D show further process of a process flow for manufacturing a semiconductor device having two trench isolations in accordance with an embodiment;

FIG. 11 shows a flow diagram illustrating a method for manufacturing a semiconductor device in accordance with another embodiment.

DETAILED DESCRIPTION OF ILLUSTRATIVE EMBODIMENTS

Figure 1:
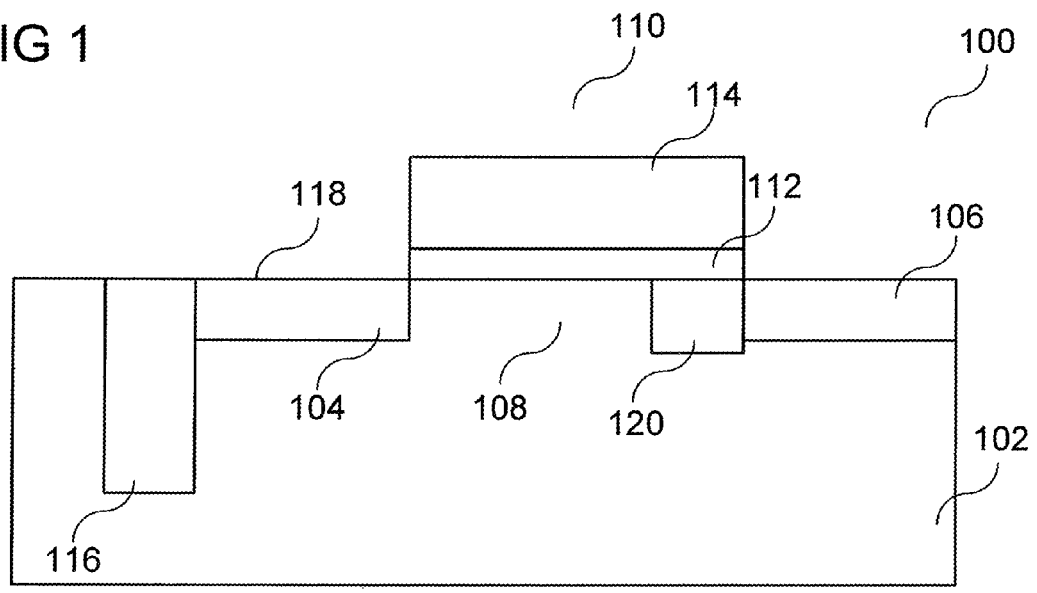
FIG. 1 shows a semiconductor device in accordance with an embodiment.

FIG. 1 shows a semiconductor device 100, implemented as a field effect transistor, in accordance with an embodiment. In an embodiment, the semiconductor device 100 may be implemented as a metal-oxide-semiconductor (MOS) field effect transistor. In an implementation, the semiconductor device 100 may be configured as a drain-extended metal-oxide-semiconductor (DeMOS) field effect transistor. In the following examples, the field effect transistor is configured as an n-channel field effect transistor. However, it should be noted that the field effect transistors of various examples may also be implemented as a p-channel field effect transistor in alternative examples, in which case the conductivity types of the respectively doped regions of the field effect transistors would be exchanged.

As shown in FIG. 1, the semiconductor device 100 may be formed in a substrate 102. In an embodiment, the substrate (e.g. a wafer substrate) 102 may be made of semiconductor materials of various types, including silicon, germanium, Group III to V or other types, including polymers, for example, although in another embodiment, other suitable materials can also be used. In an embodiment, the substrate 102 is made of silicon (doped or undoped), in an alternative embodiment of the invention, the substrate 102 is a silicon on insulator (SOI) wafer. As an alternative, any other suitable semiconductor materials can be used for the substrate 102, for example semiconductor compound material such as gallium arsenide (GaAs), indium phosphide (InP), but also any suitable ternary semiconductor compound material or quaternary semiconductor compound material such as indium gallium arsenide (InGaAs).

The semiconductor device 100 may include a first diffusion region 104 (e.g. a first source/drain region in case of a field effect transistor; in an example, the first diffusion region 104 may be a source region of a field effect transistor) and a second diffusion region 106 (e.g. a second source/drain region in case of a field effect transistor; in an example, the second diffusion region 106 may be a drain region of a field effect transistor). In an embodiment, the semiconductor device 100 may further include a well region. The drain region may be arranged in the well region. The well region may be doped with doping atoms of the same conductivity type as the drain region.

The diffusion regions 104, 106 may be highly doped regions (e.g. in the case of an n-channel field effect transistor $n^+$-doped difusion regions 104, 106, or in the case of a p-channel field effect transistor $p^+$-doped difusion regions 104, 106). In an embodiment, the doping concentration of the highly doped regions may be in the range from about $10^{19}$ cm$^{-3}$ to about $5*10^{20}$ cm$^{-3}$ doping atoms, e.g. in the range from about $5*10^{19}$ cm$^{-3}$ to about $10^{20}$ cm$^{-3}$ doping atoms, e.g. in the range from about $8*10^{19}$ cm$^{-3}$ to about $10^{20}$ cm$^{-3}$ doping atoms. Furthermore, in an embodiment, the highly-doped regions may also be silicided or doped in a different manner. In an embodiment, the doping atoms for forming n-doped or $n^+$-doped regions may be selected from a group of materials consisting of phosphorous (P), arsenic (As), and antimony (Sb). In another embodiment, the doping atoms for forming p-doped or $p^+$-doped regions may be selected from a group of materials consisting of boron (B) and aluminium (Al).

Furthermore, in an embodiment, an active region 108 may be disposed between the first diffusion region 104 and the second diffusion region 106. The active region 108 may be understood to be a region, in which a channel (e.g. an inversion channel) of a field effect device, e.g. of a field effect transistor may be formed during operation of the field effect device upon application of respective appropriate voltages to the source/drain regions, the gate region and possible to the bulk region of the device. The active region 108 may be completely or partially filled by the formed channel. In an embodiment, the active region 108 may be lightyly doped (in case of a p-substrate 102 e.g. p⁻-doped or in case of an n-substrate 102 e.g. n⁻-doped), intrinsically doped or even partially depleted or fully depleted of charge carriers.

Furthermore, the semiconductor device 100 may include a control region 110 disposed above the active region 108. The control region 110 may include a gate insulation layer 112 (e.g. a gate oxide layer 112, e.g. made of silicon oxide) disposed above the active region 108 and a gate region 114 (e.g. made of electrically conductive material such as e.g. polysilicon or a metal such as e.g. tungsten or tungsten silicide).

Furthermore, the semiconductor device 100 may include a first trench isolation 116 disposed laterally adjacent to the first diffusion region 104 opposite to the active region 108 and the control region 110. In an embodiment, the first diffusion region 104 is disposed between the first trench isolation 116 and the active region. The first trench isolation 116 may be a shallow trench isolation (STI) having a conventional depth. The first trench isolation 116 may be configured to electrically isolate the semiconductor device 100 from an adjacent semiconductor device (not shown in FIG. 1) and therefore may also be referred to as a device isolation trench 116. In an embodiment, the first trench isolation 116 may extend into the substrate 102 from the upper surface 118 of the first diffusion region 104 or the upper surface of the substrate 102 by a depth of at least approximately about 300 nm, e.g. of at least approximately about 500 nm.

Moreover, the semiconductor device 100 may include a second trench isolation 120 disposed between the second diffusion region 106 and the active region 108. In an embodiment, the second trench isolation 120 may be disposed in a region at least partially below the control region 110. In other words, the control region 110 may be disposed above the second trench isolation 120. In an implementation, the second trench isolation 120 may have (although in general similarly manufactured as a conventional shallow trench isolation, as will be described in more detail below) a smaller depth than a conventional shallow trench isolation. Therefore, the second trench isolation 120 may illustratively be referred to as an ultra-shallow trench isolation. In an embodiment, the second trench isolation 120 may have a smaller depth than the first trench isolation 116. In an example, the second trench isolation 120 may have a depth in the range from about 10 nm to about 200 nm, e.g. in the range from about 10 nm to about 175 nm, e.g. in the range from about 10 nm to about 150 nm, e.g. in the range from about 10 nm to about 125 nm, e.g. in the range from about 10 nm to about 100 nm. By way of example, the second trench isolation 120 may extend into the substrate 102 from the upper surface 118 of the first diffusion 104 region or the upper surface of the substrate 102 by a depth in the range from about 10 nm to about 200 nm, e.g. in the range from about 10 nm to about 175 nm, e.g. in the range from about 10 nm to about 150 nm, e.g. in the range from about 10 nm to about 125 nm, e.g. in the range from about 10 nm to about 100 nm. As will be described in more detail below, the first trench isolation 116 and the second trench isolation 120 may be a trench filled with an insulation material such as e.g. with an oxide (e.g. silicon oxide), a nitride (e.g. silicon nitride), or an oxynitride (e.g. SiON).

In an example, the control region 110 may be disposed above at least a portion of the second diffusion region 106.

Figure 2:
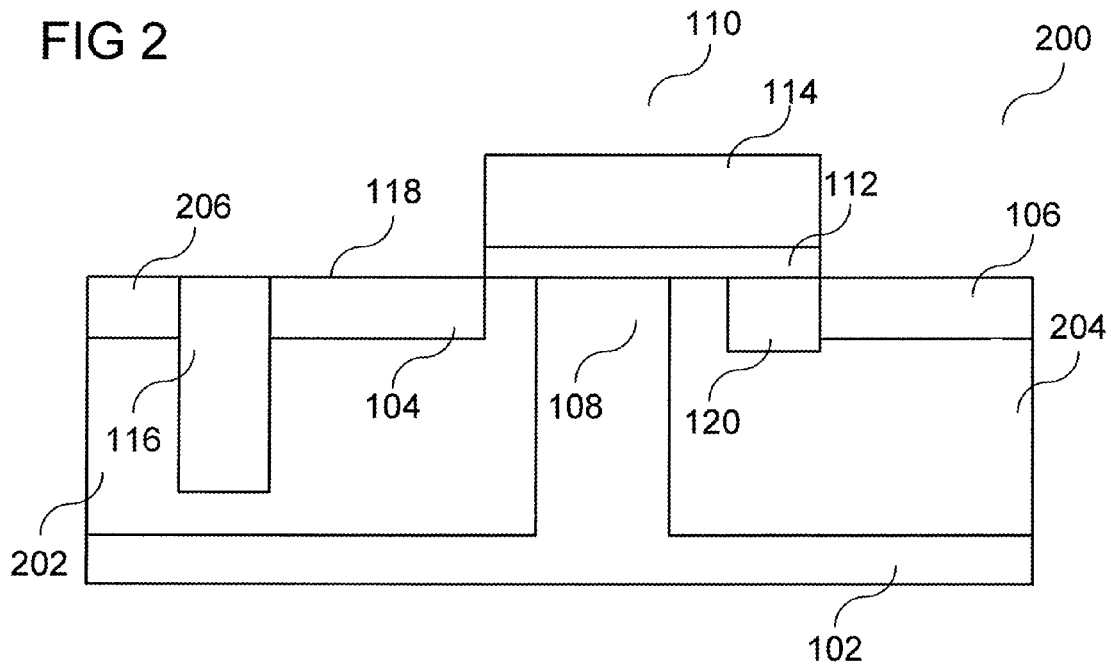
FIG. 2 shows a semiconductor device in accordance with another embodiment.

FIG. 2 shows a semiconductor device 200 in accordance with another embodiment.

The semiconductor device 200 of FIG. 2 is almost similar to the semiconductor device 100 of FIG. 1. However, compared with the semiconductor device 100 of FIG. 1, the semiconductor device 200 of FIG. 2 further includes a first well region 202 and a second well region 204 as will be described in more detail below. It should be noted that in an alternative embodiment, only the first well region 202 (and not the second well region 204) or only the second well region 204 (and not the first well region 202) may be provided. Furthermore, a semiconductor device having a triple well structure or even a quadrupel well structure may be provided in an alternative embodiment.

As shown in FIG. 2, the first diffusion region 104 and the first trench isolation 116 may be formed in the first well region 202. The first well region 202 may be a p-well (in case of an n-channel device) or an n-well (in case of a p-channel device). Furthermore, the second diffusion region 106 and the second trench isolation 120 may be formed in the second well region 204. The second well region 204 may be an n-well (in case of an n-channel device) or a p-well (in case of an n-channel device).

The doping concentration of the doping atoms in the first well region 202 may be in the range from about $10^{16}$ cm$^{-3}$ to about $10^{19}$ cm$^{-3}$ doping atoms, e.g. in the range from about $10^{17}$ cm$^{-3}$ to about $5*10^{18}$ cm$^{-3}$ doping atoms, e.g. in the range from about $5*10^{17}$ cm$^{-3}$ to about $2*10^{18}$ cm$^{-3}$ doping atoms.

The doping concentration of the doping atoms in the second well region 204 may be in the range from about $10^{16}$ cm$^{-3}$ to about $10^{19}$ cm$^{-3}$ doping atoms, e.g. in the range from about $10^{17}$ cm$^{-3}$ to about $5*10^{18}$ cm$^{-3}$ doping atoms, e.g. in the range from about $5*10^{17}$ cm$^{-3}$ to about $2*10^{18}$ cm$^{-3}$ doping atoms.

Furthermore, as also shown in FIG. 2 a further highly doped region 206 may be provided in the first well region 202 laterally adjacent to the first trench isolation 116 opposite to the first diffusion region 104. The further highly doped region 206 may be p⁺-doped in case of an n-channel device or n⁺-doped in case of an p-channel device. The doping concentration of the doping atoms in the further highly doped region 206 may be in the range from about $10^{19}$ cm$^{-3}$ to about $5*10^{20}$ cm$^{-3}$ doping atoms, e.g. in the range from about $5*10^{19}$ cm$^{-3}$ to about $10^{20}$ cm$^{-3}$ doping atoms, e.g. in the range from about $8*10^{19}$ cm$^{-3}$ to about $10^{20}$ cm$^{-3}$ doping atoms. Furthermore, in an embodiment, the highly-doped regions may also be silicided or doped in a different manner.

The semiconductor devices in accordance with various embodiments illustratively may provide a drain extended MOS (DeMOS) device with sufficient dielectric and hot carrier reliability without a degraded mixed signal performance at high voltage I/O interfaces in scaled CMOS technologies. The extended drain region may be used to reduce the voltage at the thin gate oxide of the device.

Furthermore, various embodiments provide for a dual trench isolation device. Illustratively, in various embodiments, DeMOS devices with an ultra shallow trench isolation (USTI) of a reduced depth compared to the standard STI used for isolation between the devices are provided. This may improve the gate dielectric and hot carrier reliability without degrading its mixed signal performance. It should be mentioned that in various embodiments, the USTI can have any location underneath a gate-to-drain overlap region and can have any thickness, which may be selected depending on an optimum $R_{ON}$ (On-Resistance) and $I_{ON}$ (On-current) of the semiconductor device.

Furthermore, various embodiments may be based on a dual trench isolation process, and may provide for one or more of the following effects:

The semiconductor devices and the methods for manufacturing the same (which will be described in more detail below) may be applicable for scaled technology nodes.

The semiconductor devices may provide an improved gate oxide and hot carrier reliability as compared to LDDMOS and DeMOS as will be described in more detail below.

The semiconductor devices may provide that there is reduced or even no degradation in mixed signal performance as compared to LDDMOS and DeMOS as will be described in more detail below.

The methods for manufacturing the semiconductor devices (which will be described in more detail below) may saves two mask steps which are usually required for manufacturing conventional LDDMOS semiconductor devices, the mask steps being named (1) LDD implantation mask and (2) Silicide blocking mask from the standard LDDMOS process flow.

Figure 3:
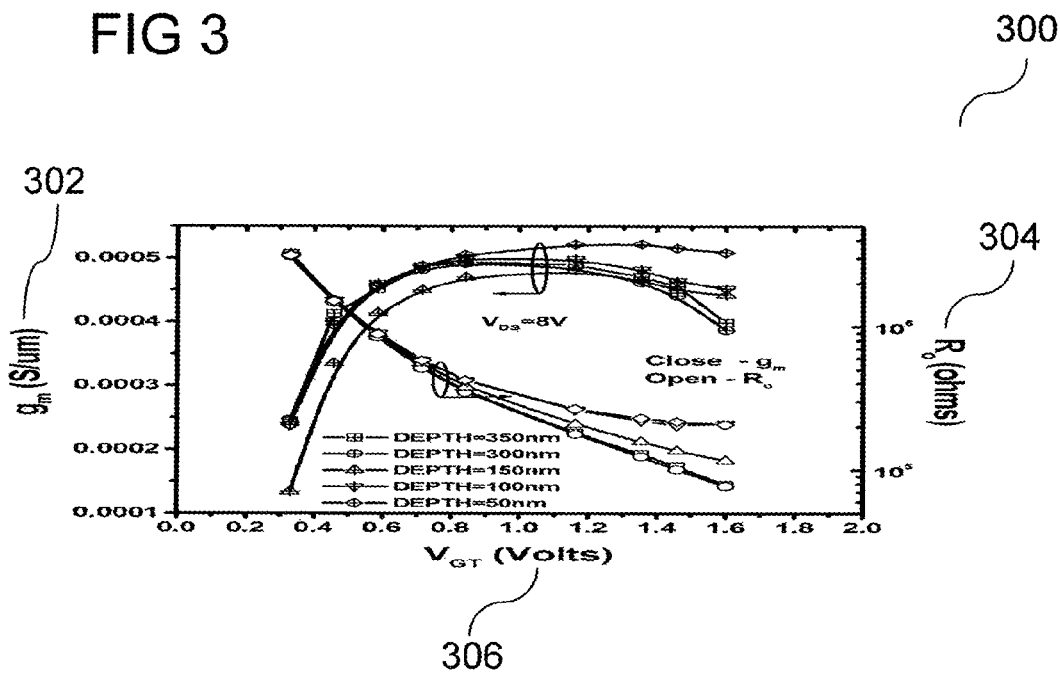
FIG. 3 shows a diagram illustrating the analog/radio frequency performance of various semiconductor devices in accordance with various embodiments.

FIG. 3 shows a diagram 300 illustrating the analog/radio frequency performance of various semiconductor devices in accordance with various embodiments. In more detail, the diagram 300 shows the electrical conductance $g_m$ (in units of S/μm) 302 and the open circuit electrical resistance $R_0$ (in units of ohms) 304 of semiconductor devices in accordance with various embodiments dependent on a gate-threshold voltage $V_{GT}$ 306 (the gate-threshold voltage $V_{GT}$ may be understood as the difference between an applied gate-source voltage $V_{GS}$ and the threshold voltage $V_{TH}$ of the semiconductor device (in the case of a field effect transistor, the threshold voltage is the gate source voltage at which the field effect transistor begins to conduct; at this voltage, the channel of the minority charge carriers starts to be created); in other words $V_{GT}=V_{GS}-V_{TH}$). These characteristics are measured and illustrated for various semiconductor devices having different depths of the second trench isolation. As is shown in FIG. 3, the semiconductor devices having depths of the second trench isolation in the range from about 10 nm to about 200 nm show a very good and steep increase of the electrical conductance $g_m$ 302 with increasing gate-threshold voltage $V_{GT}$ 306 and further a steep decrease of the open circuit electrical resistance $R_0$ 304 with increasing gate-threshold voltage $V_{GT}$ 306, thus showing very good mixed signal performance.

Figure 4:
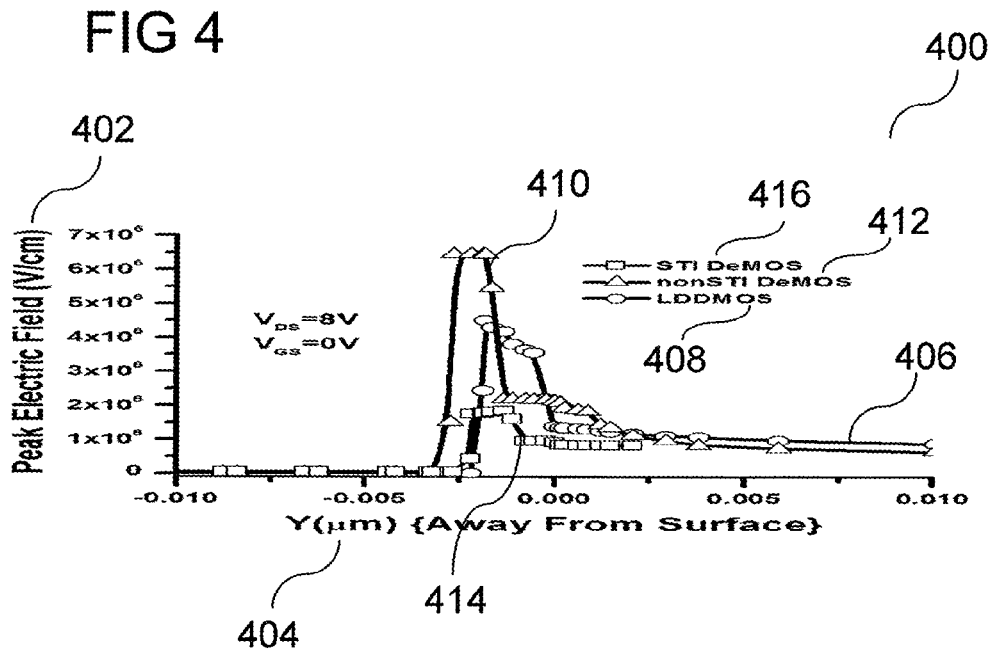
FIG. 4 shows a diagram illustrating the electric field along the gate oxide of various semiconductor devices.

FIG. 4 shows a diagram 400 illustrating the electric field along the gate oxide of various semiconductor devices. In more detail, the diagram 400 shows the peak electrical field (in units of V/cm) 402 dependent on the distance Y 404 from the upper surface of the substrate (in units of μm). Diagram 400 includes a first characteristic 406 of a conventional LDDMOS device 408, a second characteristic 410 of a non-STI DeMOS device 412, and a third characteristic 414 of an STI DeMOS device 416 in accordance with an embodiment. As can be gathered from these characteristics 406, 410, 414, the STI DeMOS device 416 in accordance with an embodiment shows the smallest peak in the electrical field, thereby showing the least stress for its gate oxide.

It is to be noted that the manufacturing of the semiconductor devices in accordance with various embodiments needs one more mask step at the initial stage of device fabrication to make the ultra shallow trench isolation (USTI). After deep STI formation, a mask is required to etch the USTI and then it should be filled by an isolating material such as e.g. an oxide (e.g. silicon oxide) followed by a chemical mechanical polishing (CMP) process.

FIGS. 5A to 5I show a process flow for manufacturing an intermediate semiconductor device having two trench isolations in accordance with an embodiment.

As shown in FIG. 5A, the process flow may start with a wafer substrate 502, e.g. a silicon wafer substrate 502 or another substrate material as outlined above. A photoresist layer 504 may be deposited (e.g. spinned on) onto the entire upper surface of the silicon wafer substrate 502, thereby forming a first intermediate structure 500.

Then, as shown in FIG. 5B, the photoresist layer 504 may be patterned by using a lithographic process and an etching process, thereby forming a patterned photoresist layer 512 having one or more openings 514 through the entire patterned photoresist layer 512 at those locations at which the first trench isolations are to be formed. Thus, a second intermediate structure 510 is formed.

Next, as shown in FIG. 5C, using the patterned photoresist layer 512 as a mask, one or more deep trenches 522 are etched into the substrate 502 to a depth of a conventional shallow trench isolation structure, e.g. to a depth from the upper surface 524 of the substrate 502 into the substrate 502 of at least 300 nm, e.g. of at least 500 nm. Thus, a third intermediate structure 520 is formed.

Then, as shown in FIG. 5D, the patterned photoresist layer 512 may be removed, thereby forming a fourth intermediate structure 530.

Then, as shown in FIG. 5E, photoresist material is deposited (e.g. spinned on) onto the fourth intermediate structure 530, thereby filling the one or more deep trenches 522 and entirely covering the upper surface 524 of the substrate 502. Thus, a photoresist structure 542 is formed. Thus, a fifth intermediate structure 540 is formed.

Then, as shown in FIG. 5F, the photoresist structure 542 may be patterned by using a lithographic process and an etching process, thereby forming a patterned photoresist structure 552 having one or more openings 554 through the entire patterned photoresist structure 552 at those locations at which the second trench isolations are to be formed. Thus, a sixth intermediate structure 550 is formed.

Figure 5G:
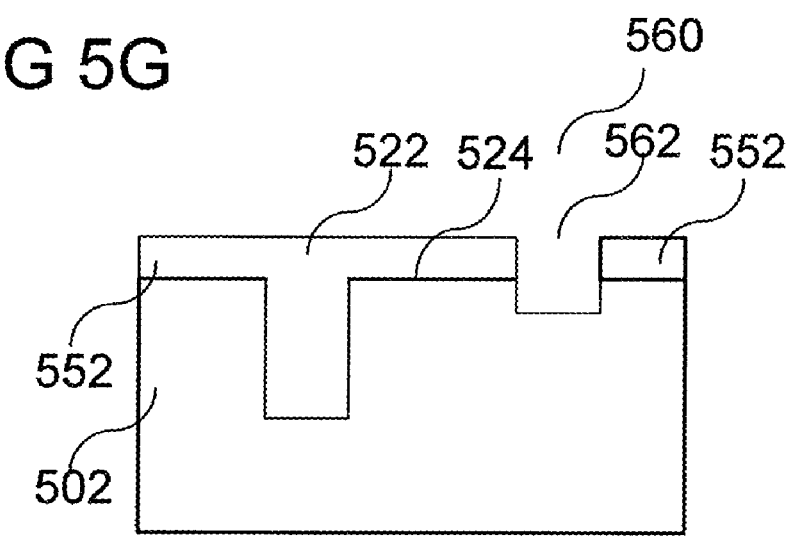

Next, as shown in FIG. 5G, using the patterned photoresist structure 552 as a mask, one or more shallower trenches 562 (compared with the one or more deep trenches 522 previously formed) are etched into the substrate 502 to a depth from the upper surface 524 of the substrate 502 into the substrate 502 in the range from about 10 nm to about 200 nm, e.g. in the range from about 10 nm to about 175 nm, e.g. in the range from about 10 nm to about 150 nm, e.g. in the range from about 10 nm to about 125 nm, e.g. in the range from about 10 nm to about 100 nm. Thus, a seventh intermediate structure 560 is formed.

Figure 5H:
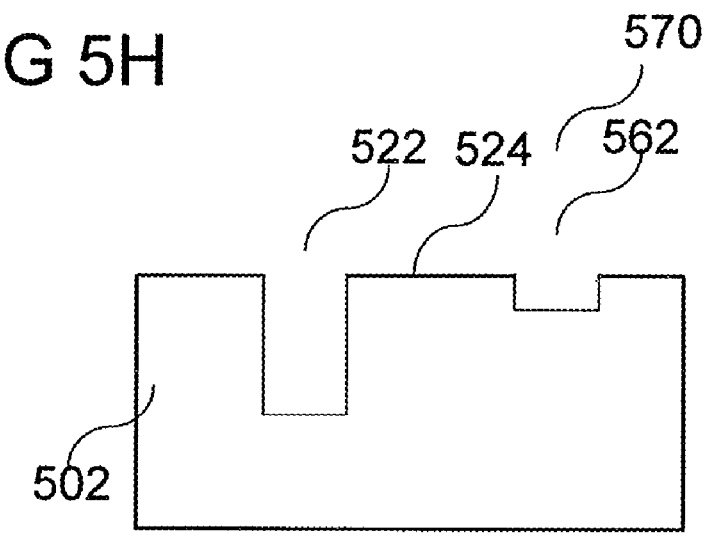

Then, as shown in FIG. 5H, the patterned photoresist structure 552 may be removed, thereby forming an eighth intermediate structure 570.

Figure 5I:
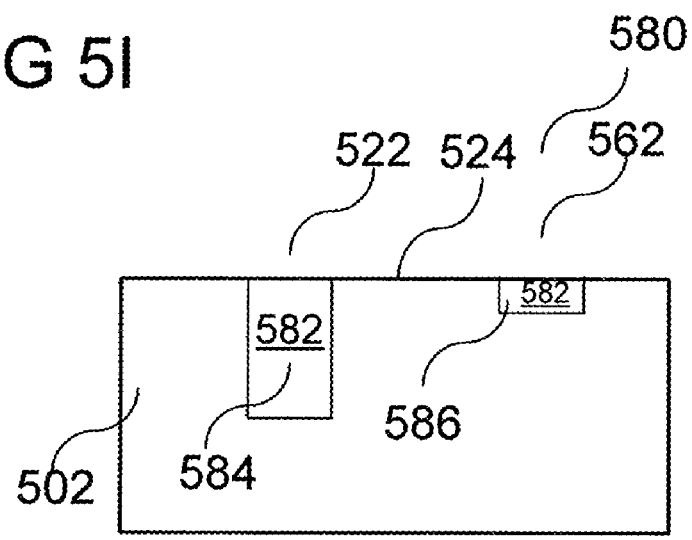

In a following process, as shown in FIG. 5I, the one or more deep trenches 522 and the one or more shallower trenches 562 may be filled with electrically isolating material 582 such as e.g. an oxide, e.g. silicon oxide. The deposited electrically isolating material 582 overfilling the one or more deep trenches 522 and the one or more shallower trenches 562 may be removed by a planarization process such as e.g. by a chemical mechanical polishing process (CMP). Thus, a ninth intermediate structure 580 is formed having one or more first trench isolations 584 and one or more second trench isolations 586, which have therefore a smaller depth than the one or more first trench isolations 584.

The rest of the process flow may be the same as the standard DeMOS process flow, as will be described in more detail below.

FIGS. 6A to 6I show a process flow for manufacturing an intermediate semiconductor device having two trench isolations in accordance with another embodiment.

As shown in FIG. 6A, the process flow may start with a wafer substrate 602, e.g. a silicon wafer substrate 602 or another substrate material as outlined above. A photoresist layer 604 may be deposited (e.g. spinned on) onto the entire upper surface of the silicon wafer substrate 602, thereby forming a first intermediate structure 600.

Then, as shown in FIG. 6B, the photoresist layer 604 may be patterned by using a lithographic process and an etching process, thereby forming a patterned photoresist layer 612 having one or more openings 614 through the entire patterned photoresist layer 612 at those locations at which the first trench isolations are to be formed. Thus, a second intermediate structure 610 is formed.

Next, as shown in FIG. 6C, using the patterned photoresist layer 612 as a mask, one or more deep trenches 622 are etched into the substrate 602 to a depth of a conventional shallow trench isolation structure, e.g. to a depth from the upper surface 624 of the substrate 602 into the substrate 602 of at least 300 nm, e.g. of at least 500 nm. Thus, a third intermediate structure 620 is formed.

Next, as shown in FIG. 6D, the patterned photoresist layer 612 may be removed and the one or more deep trenches 622 may be filled with electrically isolating material 632 such as e.g. an oxide, e.g. silicon oxide. The deposited electrically isolating material 632 overfilling the one or more deep trenches 522 may be removed by a planarization process such as e.g. by a chemical mechanical polishing process (CMP). Thus, a fourth intermediate structure 630 is formed.

Then, as shown in FIG. 6E, photoresist material is deposited (e.g. spinned on) onto the fourth intermediate structure 630 entirely covering the upper surface 524 of the substrate 502 and the upper surface of the electrically isolating material 632 filled into the one or more deep trenches 622. Thus, a photoresist structure 642 is formed. Thus, a fifth intermediate structure 640 is formed.

Then, as shown in FIG. 6F, the photoresist structure 642 may be patterned by using a lithographic process and an etching process, thereby forming a patterned photoresist structure 652 having one or more openings 654 through the entire patterned photoresist structure 652 at those locations at which the second trench isolations are to be formed. Thus, a sixth intermediate structure 650 is formed.

Figure 6G:
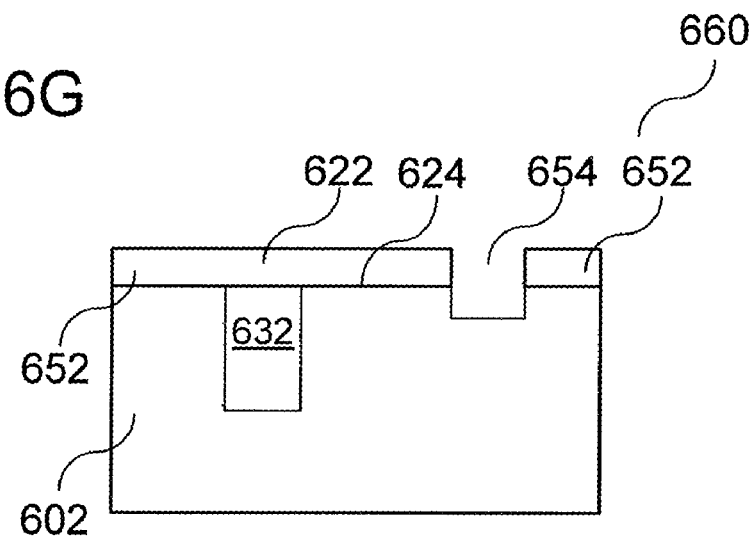

Next, as shown in FIG. 6G, using the patterned photoresist structure 652 as a mask, one or more shallower trenches 662 (compared with the one or more deep trenches 622 previously formed) are etched into the substrate 602 to a depth from the upper surface 624 of the substrate 602 into the substrate 602 in the range from about 10 nm to about 200 nm, e.g. in the range from about 10 nm to about 175 nm, e.g. in the range from about 10 nm to about 150 nm, e.g. in the range from about 10 nm to about 125 nm, e.g. in the range from about 10 nm to about 100 nm. Thus, a seventh intermediate structure 660 is formed.

Figure 6H:
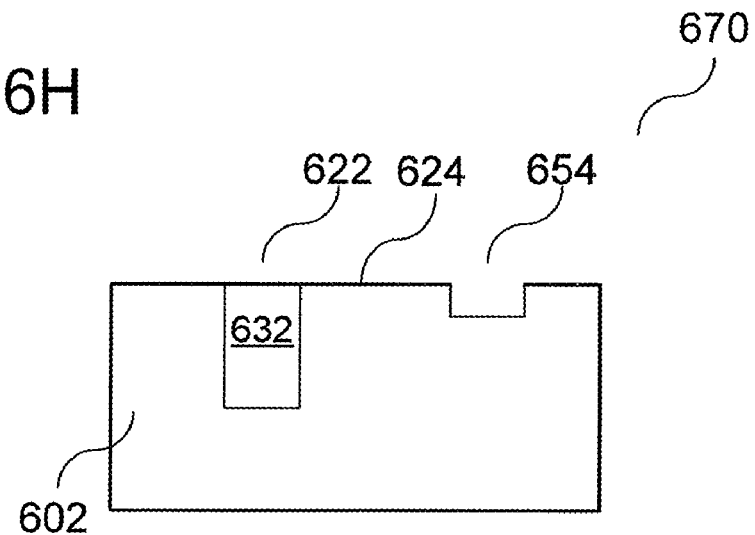

Then, as shown in FIG. 6H, the patterned photoresist structure 652 may be removed, thereby forming an eighth intermediate structure 670.

Figure 6I:
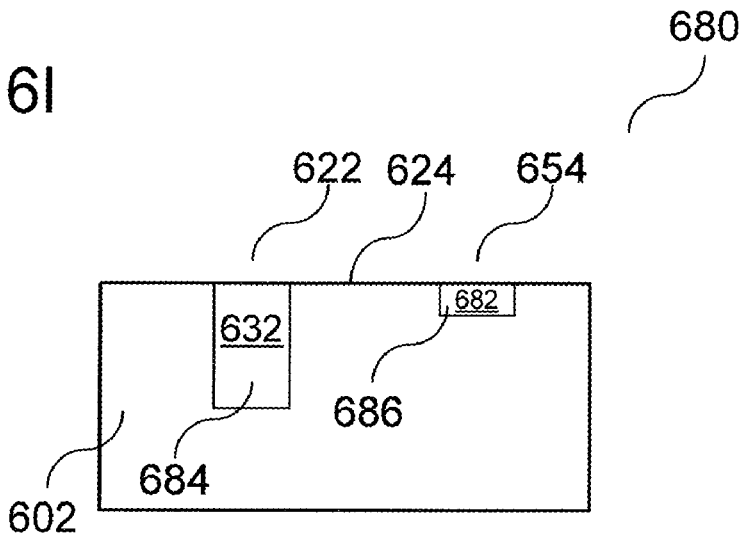

In a following process, as shown in FIG. 6I, the one or more shallower trenches 662 may be filled with electrically isolating material 682 such as e.g. an oxide, e.g. silicon oxide. The deposited electrically isolating material 682 overfilling the one or more shallower trenches 662 may be removed by a planarization process such as e.g. by a chemical mechanical polishing process (CMP). Thus, a ninth intermediate structure 680 is formed having one or more first trench isolations 684 and one or more second trench isolations 686, which have therefore a smaller depth than the one or more first trench isolations 684.

The rest of the process flow may be the same as the standard DeMOS process flow, as will be described in more detail below.

Starting e.g. from the ninth intermediate structure 580 shown in FIG. 5 or from the ninth intermediate structure 680 shown in FIG. 6, the process may continue as shown in FIGS. 7A to 7D.

Figure 7A:
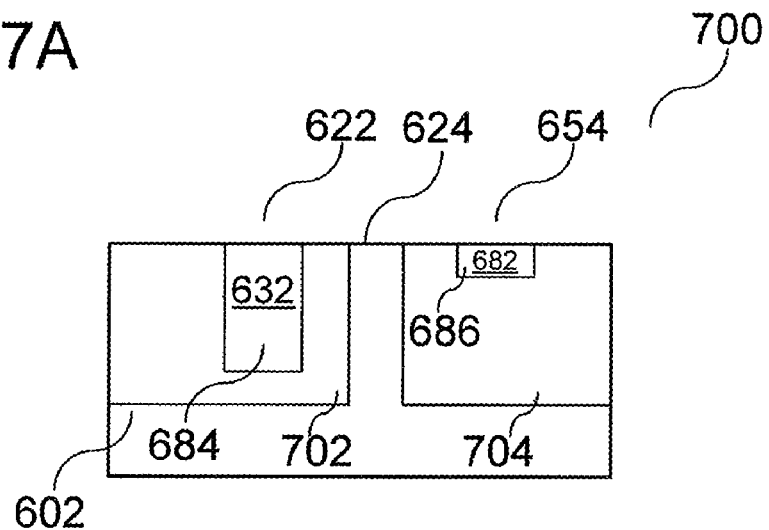

As shown in FIG. 7A, in a following process, wells may be formed by implanting respective doping atoms. In an embodiment, a first well 702 may be formed which may include the first trench isolations 584, 684 and a second well 704 may be formed which may include the second trench isolations 586, 686. In an embodiment, in which the semiconductor device to be formed is an n-channel device, the first well 702 may be formed as a p-well by implanting p-doping atoms and the second well 704 may be formed as an n-well by implanting n-doping atoms (in this embodiment, the substrate may include a p-body substrate). In another embodiment, in which the semiconductor device to be formed is a p-channel device, the first well 702 may be formed as an n-well by implanting n-doping atoms and the second well 704 may be formed as a p-well by implanting p-doping atoms (in this embodiment, the substrate may be include another well, e.g. an n-well (not shown) including the first well 702 and the second well 704, wherein the further well may be formed in a p-body substrate). Thus, a tenth intermediate structure 700 is formed.

Figure 7B:
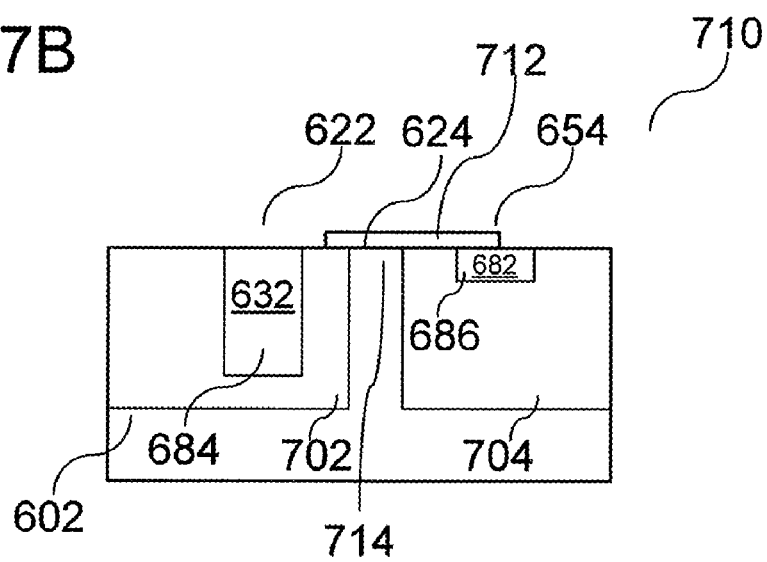

As shown in FIG. 7B, in a following process, a gate isolation layer 712 may be deposited and patterned such that the gate isolation layer 712 covers, for each semiconductor device to be manufactured, the exposed upper surface of the body region 714, a portion of the exposed upper surface of the second well 704 between the exposed upper surface of the body region 714 and the second isolation trench 586, 686, at least a portion of the exposed upper surface second isolation trench 586, 686, as well as a portion of the exposed upper surface of the first well 702 (such that there remains exposed a portion of the first well 702 for a formation of the first sourc/drain region to be formed within the first well 702). Thus, an eleventh intermediate structure 710 is formed.

Figure 7C:
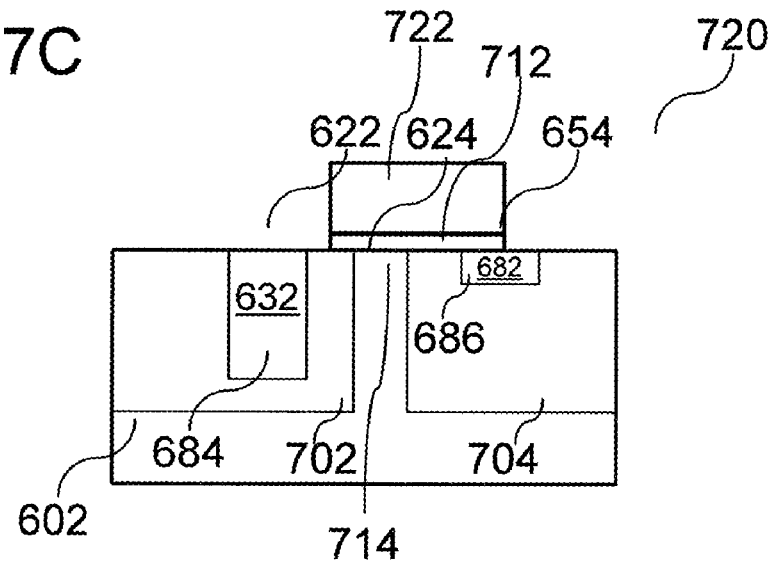

Then, as shown in FIG. 7C, a gate region 722 may be formed by depositing electrically conductive material such as e.g. polysilicon or a metal such as e.g. tungsten or tungsten silicide on the entire upper surface of the eleventh intermediate structure 710 and by carrying out a patterning process, thereby forming a gate region 722. Thus, a twelfth intermediate structure 720 is formed.

It is to be noted that in an alternative embodiment, the gate isolation layer may first be deposited on the entire upper surface of the tenth intermediate structure 700 and the electrically conductive material may be deposited on the entire upper surface of the gate isolation layer. Then, the two layers may be commonly patterned to form the gate stack including the gate region 722.

Then, as shown in FIG. 7D, gate spacers 732 may be formed (e.g. made of an oxide or a nitride, e.g. made of silicon oxide or silicon nitride) at the sidewalls of the gate region 722 using an as such conventional spacer process. Then, using various implantation processes, the first source/drain region 734 (e.g. a source region 734), the second source/drain region 736 (e.g. a drain region 736), and a substrate doping region 738 may be formed. In more detail, the first source/drain region 734 and the second source/drain region 736 may be highly n-doped (n+-doped) with n-doping atoms in case of an n-channel device to be manufactured and may be highly p-doped (p+-doped) with p-doping atoms in case of a p-channel device to be manufactured. Furthermore, the substrate doping region 738 which may be arranged next to the first isolation trench 584, 684 opposite to the first source/drain region 734 may be formed by another implantation process. In an example, the substrate doping region 738 may be highly p-doped (p+-doped) with p-doping atoms in case of an n-channel device to be manufactured and may be highly n-doped (n+-doped) with n-doping atoms in case of a p-channel device to be manufactured. Furthermore, terminals may be formed being electrically connected to respective regions to be electrically controlled via the terminals of the semiconductor device to be formed. In an example, a gate terminal 740 may be formed and may be electrically connected to the gate region 722, a source terminal 742 may be formed and may be electrically connected to the source region 734, a drain terminal 744 may be formed and may be electrically connected to the drain region 736, and a substrate terminal 746 may be formed and may be electrically connected to the substrate doping region 738. Thus, after possibly additionally back-end-of-line processes, the semiconductor device is completed.

Various embodiments provide an improved mixed signal performance of a Drain extended MOS device having high breakdown (higher than LDDMOS in the same technology node) with improved gate dielectric and hot carrier reliability.

Figure 8:
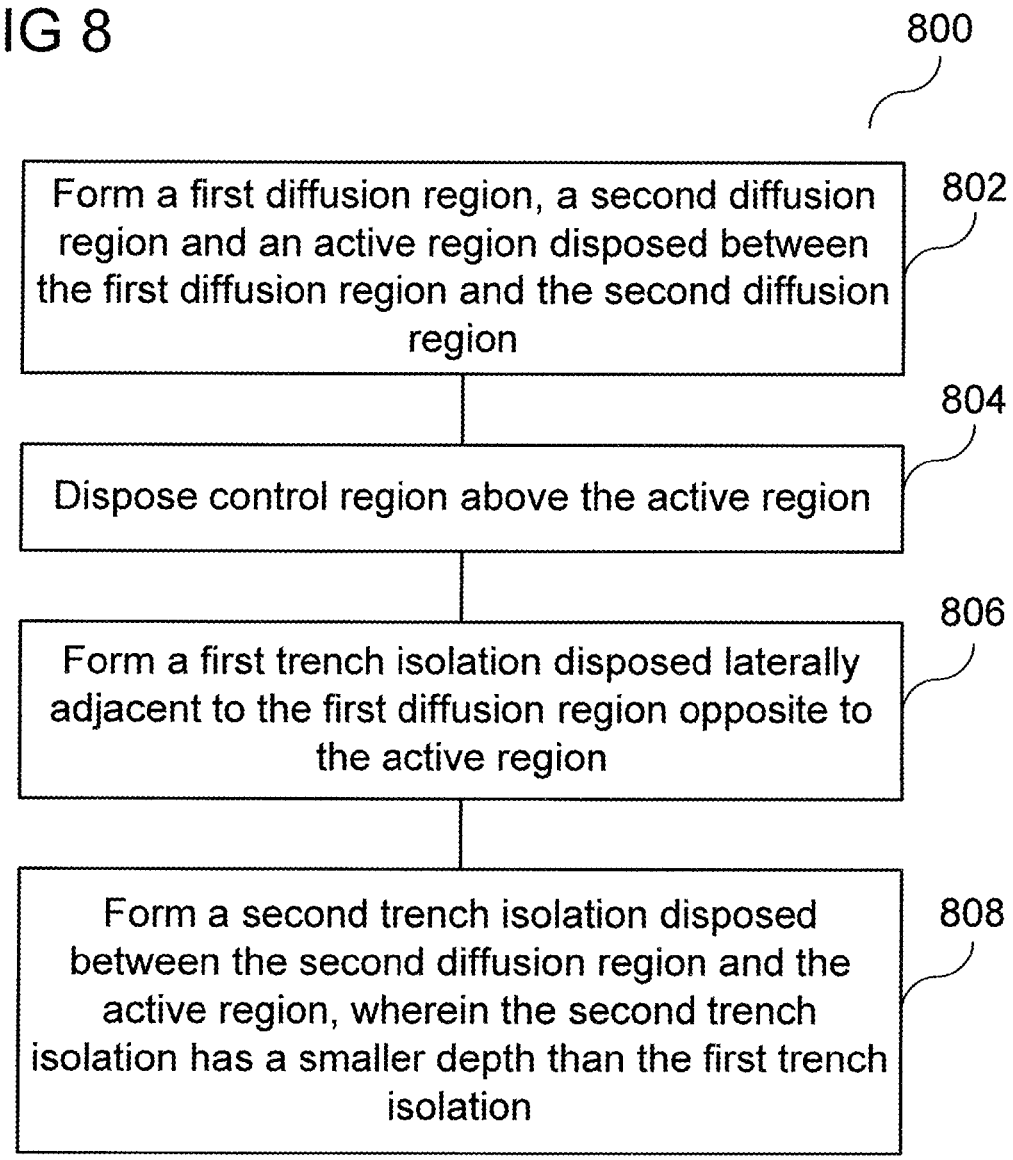
FIG. 8 shows a flow diagram illustrating a method for manufacturing a semiconductor device in accordance with an embodiment.

FIG. 8 shows a flow diagram 800 illustrating a method for manufacturing a semiconductor device in accordance with an embodiment. In 802, a first diffusion region, a second diffusion region and an active region disposed between the first diffusion region and the second diffusion region are formed. Furthermore, in 804, a control region is disposed above the active region. Then, in 806, a first trench isolation is formed disposed laterally adjacent to the first diffusion region opposite to the active region. Furthermore, in 808, a second trench isolation is formed disposed between the second diffusion region and the active region, wherein the second trench isolation has a smaller depth than the first trench isolation.

In an example of this embodiment, the first trench isolation may be formed as a shallow trench isolation. In another example of this embodiment, the control region may be disposed above at least a portion of the second diffusion region. In yet another example of this embodiment, the second trench isolation may be disposed between the control region and the portion of the second diffusion region. In yet another example of this embodiment, the diffusion regions may be formed as source/drain regions. In yet another example of this embodiment, the second diffusion region may be formed as a drain region. In yet another example of this embodiment, the semiconductor device may include a well region. The drain region may be arranged in the well region, and the well region may be doped with doping atoms of the same conductivity type as the drain region.

In yet another example of this embodiment, the semiconductor device may be formed as a field effect transistor. In yet another example of this embodiment, the semiconductor device is formed as a metal-oxide-semiconductor (MOS) field effect transistor, e.g. as a drain-extended metal-oxide-semiconductor field effect transistor. In yet another example of this embodiment, the second trench isolation may be formed by filling a trench with an oxide such as e.g. with silicon oxide.

Figure 9:
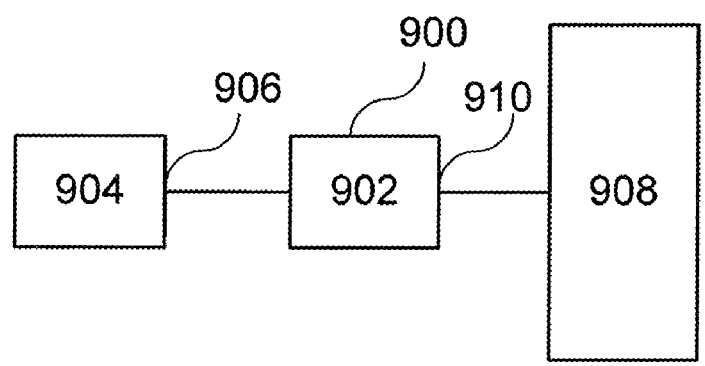
FIG. 9 shows an electronic circuit in accordance with an embodiment.

The semiconductor devices in accordance with various embodiments may be provided in an electronic circuit. As an example, FIG. 9 shows an electronic circuit 900 including a transistor 902. The transistor may have the same structure as the semiconductor devices previously described. By way of example, the transistor 902 (e.g. a field effect transistor) may include a first diffusion region, a second diffusion region, an active region disposed between the first diffusion region and the second diffusion region, a control region disposed above the active region, a first trench isolation disposed laterally adjacent to the first diffusion region opposite to the active region, and a second trench isolation disposed between the second diffusion region and the active region, wherein the second trench isolation has a smaller depth than the first trench isolation.

The electronic circuit 900 may be configured as a driver circuit, e.g. as an input/output driver circuit. In this example, one or more pads 904 may be provided to which one or more first terminals 906 of the electronic circuit 900 may be coupled. Furthermore, a driven circuit 908 such as e.g. a processor such as e.g. a microprocessor (e.g. a CISC (complex instruction set computer) processor or a RISC (reduced instruction set computer) processor) may be provided to which one or more second terminals 910 of the electronic circuit 900 may be coupled.

In an alternative embodiment, the electronic circuit 900 may be configured as an amplifier circuit, e.g. as a power amplifier circuit, e.g. as a radio frequency power amplifier circuit.

In an alternative embodiment, the electronic circuit 900 may be configured as a high voltage circuit, e.g. as a high voltage radio frequency circuit.

In an embodiment, a device (ultra shallow trench isolation DeMOS) is processed in a dual STI process, where the deeper STI may be used as isolation between devices and the shallower STI as a protective layer underneath the drain edge of the gate of so-called drain extended high voltage devices. The small shallow STI region underneath the gate-to-drain overlap region may protect against gate oxide breakdown and may improve hot carrier reliability without degrading the mixed signal performance.

FIGS. 10A to 10D show another process flow for manufacturing a semiconductor device in accordance with another embodiment starting e.g. from the sixth intermediate structure 650 shown in FIG. 6.

Figure 10A:
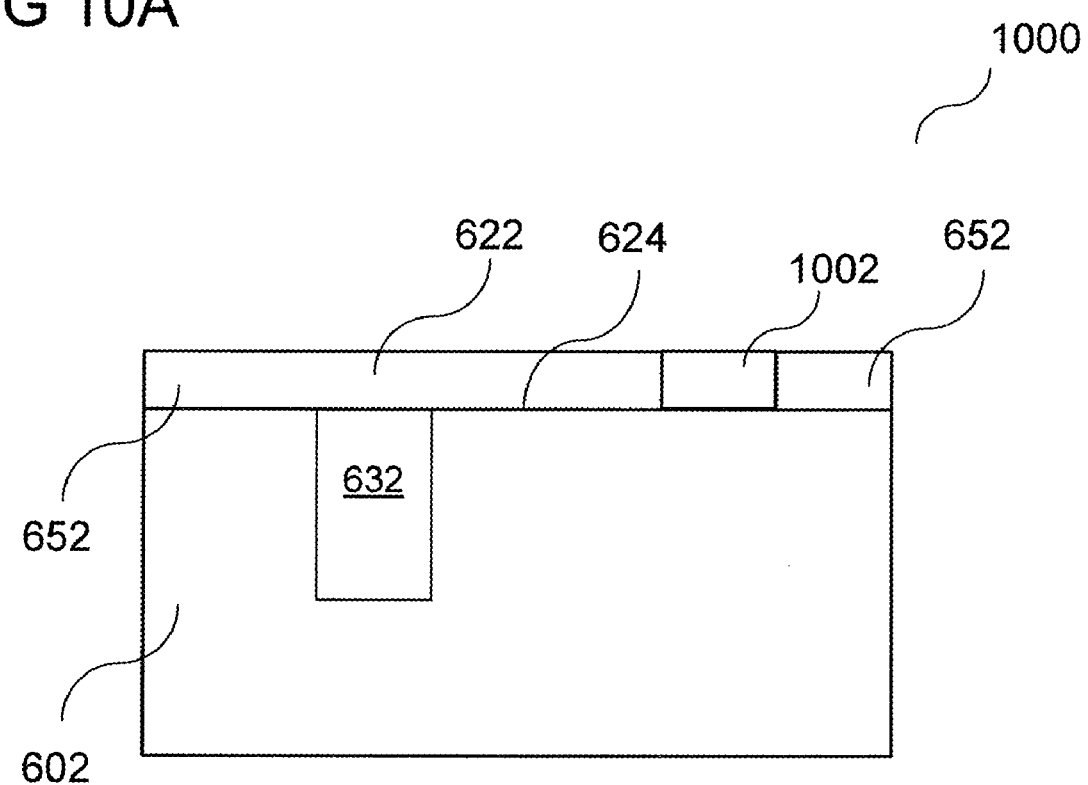
FIGS. 10A to 10D show another process flow for manufacturing a semiconductor device in accordance with another embodiment.

As shown in FIG. 10A, the one or more openings 654 may be filled (partially or fully) with electrically conductive material 1002 such as e.g. polysilicon. Thus, a structure 1000 is formed.

Figure 10B:
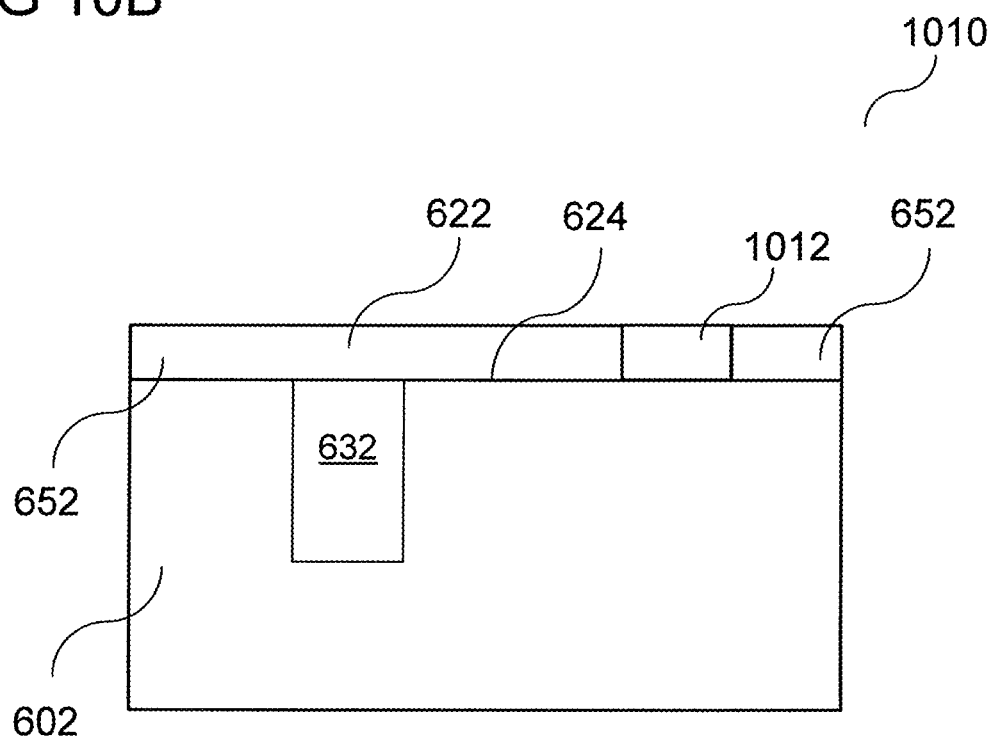

Next, as shown in FIG. 10B, the electrically conductive material 1002 is converted into electrically isolating material 1012. This process may be carried out by an oxidation e.g. of the polysilicon to form silicon oxide 1012. Thus, a structure 1010 is formed.

Figure 10C:
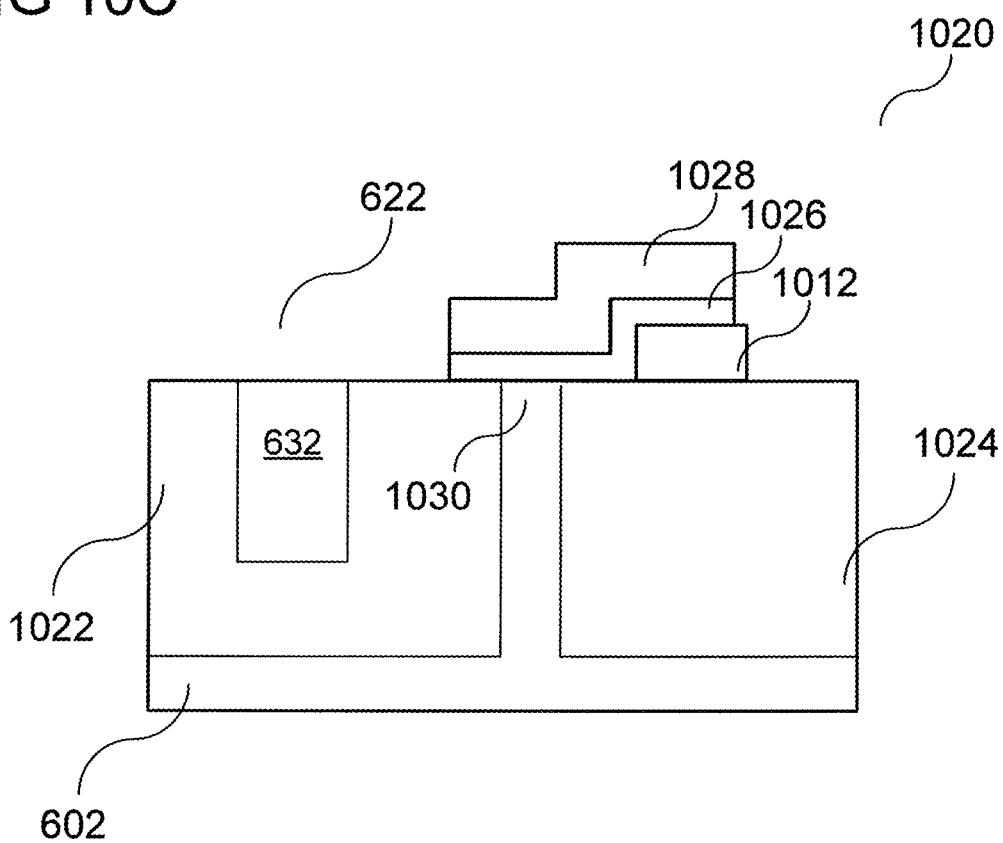

Then, as shown in FIG. 10C, in an embodiment, a first well 1022 may be formed which may include the first trench isolations 684 and a second well 1024 may be formed below the electrically isolating material 1012. In an embodiment, in which the semiconductor device to be formed is an n-channel device, the first well 1022 may be formed as a p-well by implanting p-doping atoms and the second well 1024 may be formed as an n-well by implanting n-doping atoms (in this embodiment, the substrate may include a p-body substrate). In another embodiment, in which the semiconductor device to be formed is a p-channel device, the first well 1022 may be formed as an n-well by implanting n-doping atoms and the second well 1024 may be formed as a p-well by implanting p-doping atoms (in this embodiment, the substrate may be include another well, e.g. an n-well (not shown) including the first well 1022 and the second well 1024, wherein the further well may be formed in a p-body substrate). Furthermore, a control region may be formed e.g. by first depositing a gate isolation layer 1026 (e.g. made of an oxide such as e.g. silicon oxide) on the upper surface of the structure 1010 of FIG. 10B, followed by a deposition of a gate layer 1028 (e.g. made of electrically conductive material such as e.g. polysilicon or a metal (e.g. tungsten or tungsten silicide)). Then, the control region may be formed by patterning the gate isolation layer 1026 and the gate layer 1028 such that they cover the exposed upper surface of the body region 1030 and the upper surface of the second well 1024 between the body region 1030 and the electrically isolating material 1012 as well as at least a portion of the electrically isolating material 1012, and a portion of the first well 1022 (however, a portion of the first well 1022 remains exposed in order to form the first source/drain region (e.g. the source region) in a subsequent process, as will be described in more detail below. Thus, a structure 1020 is formed.

Figure 10D:
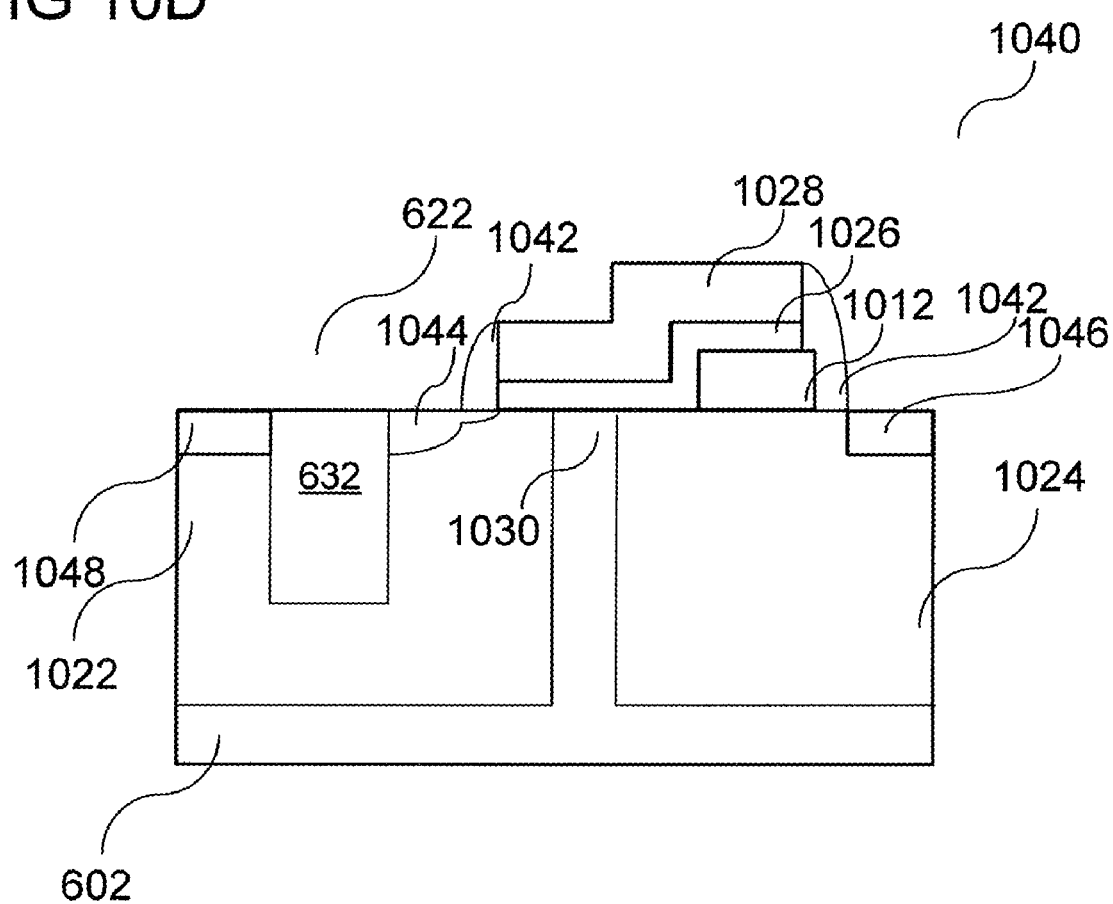

Then, as shown in FIG. 10D, gate spacers 1042 may be formed (e.g. made of an oxide or a nitride, e.g. made of silicon oxide or silicon nitride) at the sidewalls of the gate region 1028 using an as such conventional spacer process. Then, using various implantation processes, the first source/drain region 1044 (e.g. a source region 1044), the second source/drain region 1046 (e.g. a drain region 1046), and a substrate doping region 1048 may be formed. In more detail, the first source/drain region 1044 and the second source/drain region 1046 may be highly n-doped ($n^+$-doped) with n-doping atoms in case of an n-channel device to be manufactured and may be highly p-doped ($p^+$-doped) with p-doping atoms in case of a p-channel device to be manufactured. Furthermore, the substrate doping region 1048 which may be arranged next to the first isolation trench 684 opposite to the first source/drain region 1044 may be formed by another implantation process. In an example, the substrate doping region 1048 may be highly p-doped ($p^+$-doped) with p-doping atoms in case of an n-channel device to be manufactured and may be highly n-doped ($n^+$-doped) with n-doping atoms in case of a p-channel device to be manufactured. Furthermore, terminals may be formed being electrically connected to respective regions to be electrically controlled via the terminals of the semiconductor device to be formed. In an example, a gate terminal (not shown) may be formed and may be electrically connected to the gate region 1028, a source terminal (not shown) may be formed and may be electrically connected to the source region 1044, a drain terminal (not shown) may be formed and may be electrically connected to the drain region 1046, and a substrate terminal (not shown) may be formed and may be electrically connected to the substrate doping region 1048. Thus, after possibly additionally back-end-of-line processes, the semiconductor device is completed.

Thus, in this embodiment, illustratively, a small LOCOS region is formed underneath the gate to drain edge in a standard DeMOS process, whereby locally deposited electrically conductive material (e.g. polysilicon) is converted into electrically isolating material (e.g. silicon oxide).

FIG. 11 shows a flow diagram 1100 illustrating a method for manufacturing a semiconductor device in accordance with another embodiment. In 1102, an active region may be formed. In 1104, a diffusion region may be formed adjacent to the active region. Furthermore, in 1106, electrically conductive material may be disposed above the diffusion region. Then, in 1108, at least a portion of the electrically conductive material may be converted into electrically isolating material.

Furthermore, in 1110, a control region may be disposed above the active region and above at least a portion of the electrically isolating material.

In an example of this embodiment, the electrically conductive material may include or consist of polysilicon. In another example of this embodiment, the electrically isolating material may include or consist of silicon oxide.

In another embodiment, a method for manufacturing a semiconductor device is provided. The method may include forming a shallow trench isolation trench, filling the shallow trench isolation trench with dielectric material, forming an isolation trench having a depth different from the depth of the shallow trench isolation trench, and filling the trench isolation trench with dielectric material.

In another embodiment, a method for manufacturing a semiconductor device is provided. The method may include forming a shallow trench isolation trench, forming an isolation trench having a depth different from the depth of the shallow trench isolation trench, and simultaneously filling the shallow trench isolation trench and the isolation trench with dielectric material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A semiconductor device, comprising:
a body region;
a first diffusion region formed in the body region;
a second diffusion region formed in the body region;
an active region disposed between the first diffusion region and the second diffusion region;
a control region, comprising a gate region and a gate isolating region, disposed above the active region, wherein the control region overlies an upper surface of the body region;
a first trench isolation extending into the body region a first depth from the upper surface of the body region and disposed laterally adjacent to the first diffusion region opposite to the active region; and
a second trench isolation extending into the body region a second depth from the upper surface of the body region and disposed between the second diffusion region and the active region, wherein the second depth is smaller than the first depth.

2. The semiconductor device of claim 1, wherein the first trench isolation is a shallow trench isolation.

3. The semiconductor device of claim 1, wherein the control region is disposed above the second trench isolation.

4. The semiconductor device of claim 1, wherein the diffusion regions are source/drain regions.

5. The semiconductor device of claim 4, wherein the second diffusion region is a drain region.

6. The semiconductor device of claim 5, further comprising:
a well region;
wherein the drain region is arranged in the well region;
wherein the well region is doped with doping atoms of the same conductivity type as the drain region.

7. The semiconductor device of claim 1, wherein the semiconductor device is configured as a field effect transistor.

8. The semiconductor device of claim 7, wherein the field effect transistor is configured as a metal-oxide-semiconductor field effect transistor.

9. The semiconductor device of claim 8, wherein the metal-oxide-semiconductor field effect transistor is configured as a drain-extended metal-oxide-semiconductor field effect transistor.

10. The semiconductor device of claim 1, wherein the second trench isolation comprises an oxide.

11. The semiconductor device of claim 1, wherein the second trench isolation is configured to protect against breakdown of the gate isolating region compared with an identical structure without the second trench isolation.

12. A semiconductor device, comprising:
a body region;
a source/drain region formed in the body region;
an active region;
a gate region and a gate isolating region disposed above the active region wherein the gate region overlies an upper surface of the body region;
a trench isolation extending into the body region from the upper surface of the body region and disposed between the source/drain region and the active region; and
a device trench isolation extending into the body region from the upper surface of the body region;
wherein the active region is disposed between the device trench isolation and the source/drain region, the device trench isolation being configured to isolate the semiconductor device from another semiconductor device; and
wherein the trench isolation has a smaller depth extending into the body region than the device trench isolation.

13. The semiconductor device of claim 12, wherein the device trench isolation is a shallow trench isolation.

14. The semiconductor device of claim 12, wherein the gate region is disposed above the trench isolation.

15. The semiconductor device of claim 12, further comprising:
a further source/drain region;
wherein the active region is disposed between the further source/drain region and the source/drain region.

16. The semiconductor device of claim 12, wherein the source/drain region is a drain region.

17. The semiconductor device of claim 16, further comprising:
a well region;
wherein the drain region is arranged in the well region;
wherein the well region is doped with doping atoms of the same conductivity type as the drain region.

18. The semiconductor device of claim 12, wherein the semiconductor device is configured as a field effect transistor.

19. The semiconductor device of claim 12, wherein the trench isolation comprises an oxide.

20. The semiconductor device of claim 12, wherein the trench isolation is configured to protect against breakdown of the gate isolating region compared with an identical structure without the trench isolation.

21. An electronic circuit comprising a transistor, the transistor comprising:
a body region;
a first diffusion region in the body region;
a second diffusion region in the body region;
an active region disposed between the first diffusion region and the second diffusion region;
a control region, comprising a gate region and a gate isolating region, disposed above the active region, wherein the control region overlies an upper surface of the body region;
a first trench isolation extending into the body region from the upper surface of the body region and disposed laterally adjacent to the first diffusion region opposite to the active region; and
a second trench isolation extending into the body region from the upper surface of the body region and disposed between the second diffusion region and the active region, wherein the second trench isolation has a smaller depth extending into the body region than the first trench isolation.

22. The electronic circuit of claim 21, further comprising a plurality of additional transistors, the transistor and the additional transistors coupled together to form a driver circuit.

23. The electronic circuit of claim 22, wherein the the transistor and the additional transistors are coupled together to form an input/output driver circuit.

24. The electronic circuit of claim 21, further comprising a plurality of additional transistors, the transistor and the additional transistors coupled together to form an amplifier circuit.

25. The electronic circuit of claim 24, wherein the the transistor and the additional transistors are coupled together to form a power amplifier circuit.

26. The electronic circuit of claim 21, further comprising a plurality of additional transistors, the transistor and the additional transistors coupled together to form a high voltage circuit.

27. The electronic circuit of claim 26, wherein the the transistor and the additional transistors are coupled together to form a high voltage radio frequency circuit.

28. The electronic circuit of claim 21, wherein the second trench isolation is configured to protect against breakdown of the gate isolating region compared with an identical structure without the second trench isolation.

29. A semiconductor device for use in mixed signal applications, the device comprising:
mixed signal circuitry comprising a plurality of MOS transistors, each MOS transistor comprising:
a body region;
a first diffusion region in the body region;
a second diffusion region in the body region;
an active region disposed between the first diffusion region and the second diffusion region;
a control region, comprising a gate region and a gate isolating region, disposed above the active region, wherein the control region overlies an upper surface of the body region;
a first trench isolation disposed laterally adjacent to the first diffusion region opposite to the active region; and
a second trench isolation disposed between the second diffusion region and the active region, wherein the second trench isolation has a smaller depth extending into the body region from the surface than the first trench isolation, wherein the second trench isolation is configured to protect against breakdown of the gate isolating region due to a reduced peak in electric field along the gate isolating region of the control region compared with an identical structure without the second trench isolation while preventing degradation of mixed signal performance in the semiconductor device.

30. The semiconductor device of claim 29, wherein the first trench isolation is a shallow trench isolation.

31. The semiconductor device of claim 29, wherein the control region is disposed above the second trench isolation.

32. The semiconductor device of claim 29, wherein the second diffusion region is a drain region.

33. The semiconductor device of claim 32, wherein the first diffusion region is a source region.

34. The semiconductor device of claim 33, further comprising:
   a well region;
   wherein the drain region is arranged in the well region; and
   wherein the well region is doped with doping atoms of the same conductivity type as the drain region.

35. The semiconductor device of claim 29, wherein each MOS transistor is configured as a drain-extended metal-oxide-semiconductor field effect transistor.

36. The semiconductor device of claim 29, wherein the second trench isolation comprises an oxide.

* * * * *